(12) United States Patent
Li

(10) Patent No.: US 9,640,560 B2
(45) Date of Patent: May 2, 2017

(54) LIGHT-EMITTING DIODE (LED) DISPLAY PANEL, MANUFACTURING METHOD THEREOF AND DISPLAY DEVICE

(71) Applicant: BOE TECHNOLOGY GROUP CO., LTD., Beijing (CN)

(72) Inventor: Yongqian Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/762,032

(22) PCT Filed: Nov. 5, 2014

(86) PCT No.: PCT/CN2014/090390
§ 371 (c)(1),
(2) Date: Jul. 20, 2015

(87) PCT Pub. No.: WO2016/000374
PCT Pub. Date: Jan. 7, 2016

(65) Prior Publication Data
US 2016/0254274 A1    Sep. 1, 2016

(30) Foreign Application Priority Data
Jul. 1, 2014 (CN) .......................... 2014 1 0309285

(51) Int. Cl.
*H01L 33/02* (2010.01)
*H01L 27/12* (2006.01)
(Continued)

(52) U.S. Cl.
CPC ............ *H01L 27/124* (2013.01); *H01L 21/77* (2013.01); *H01L 27/1262* (2013.01);
(Continued)

(58) Field of Classification Search
CPC ......... H01L 33/00; H01L 33/32; H01L 33/64; H01L 33/56; H01L 33/507; H01L 33/508
(Continued)

(56) References Cited

U.S. PATENT DOCUMENTS 6,411,360 B1 * 6/2002 Matsuyama ........ G02F 1/13394
349/110
7,944,140 B2   5/2011 Kwak et al.
(Continued)

FOREIGN PATENT DOCUMENTS

CN        1779990 A      5/2006
CN        1893092 A      1/2007
(Continued)

OTHER PUBLICATIONS

International Search Report Appln. No. PCT/CN2014/090390; Dated Apr. 3, 2015.
(Continued)

*Primary Examiner* — Michael Lebentritt
(74) *Attorney, Agent, or Firm* — Ladas & Parry LLP

(57) ABSTRACT

A light-emitting diode (LED) display panel, a manufacturing method thereof and a display device are disclosed. The LED display panel comprises a thin-film transistor (TFT) backplane, a light-emitting structure and an overcoat (OC) layer (10). The OC layer (10) is disposed between the TFT backplane and the light-emitting structure and configured to cover gate lines (21) and data lines (22) in a display area of the LED display panel. The manufacturing process of the LED display panel adds the process of the OC layer (10) and hence can effectively avoid the scratches onto the TFT backplane caused by an evaporation mask plate when the light-emitting structure is formed and prevent the caused electrostatic problem.

17 Claims, 2 Drawing Sheets

(51) Int. Cl.
  *H01L 21/77* (2017.01)
  *H01L 27/15* (2006.01)
  *H01L 33/42* (2010.01)
  *H01L 33/44* (2010.01)
(52) U.S. Cl.
  CPC .............. *H01L 27/15* (2013.01); *H01L 33/42* (2013.01); *H01L 33/44* (2013.01)
(58) Field of Classification Search
  USPC .......................................................... 257/47
  See application file for complete search history.

(56) References Cited

U.S. PATENT DOCUMENTS

| | | | |
|---|---|---|---|
| 2004/0119399 A1 | 6/2004 | Nagayama | |
| 2006/0091785 A1 | 5/2006 | Lee et al. | |
| 2007/0002201 A1 | 1/2007 | You | |
| 2007/0008468 A1* | 1/2007 | Li | G02F 1/133555 349/114 |
| 2007/0046184 A1* | 3/2007 | Chiang | H01L 27/322 313/504 |
| 2008/0164481 A1* | 7/2008 | Tai | G09G 3/3406 257/81 |
| 2008/0252843 A1* | 10/2008 | Koike | G02F 1/1368 349/158 |
| 2009/0141223 A1* | 6/2009 | Hayashi | G02F 1/1339 349/114 |
| 2009/0179550 A1 | 7/2009 | Koo et al. | |
| 2010/0045914 A1* | 2/2010 | Mima | G02F 1/1339 349/126 |
| 2011/0222006 A1* | 9/2011 | Imanishi | G02F 1/1337 349/124 |
| 2011/0255028 A1* | 10/2011 | Nishizawa | G02F 1/133553 349/62 |
| 2012/0050235 A1 | 3/2012 | Park et al. | |
| 2013/0027645 A1* | 1/2013 | Yamakawa | G02F 1/133514 349/106 |
| 2013/0062607 A1* | 3/2013 | Yamazaki | H01L 27/0266 257/59 |
| 2013/0063674 A1* | 3/2013 | Kesho | G02F 1/134309 349/46 |
| 2014/0042397 A1 | 2/2014 | Cho et al. | |
| 2015/0021577 A1* | 1/2015 | Kadoma | H01L 51/0067 257/40 |
| 2015/0287749 A1* | 10/2015 | Miyake | G09G 3/3225 257/71 |
| 2016/0124259 A1* | 5/2016 | Kawata | G02F 1/13454 349/139 |

FOREIGN PATENT DOCUMENTS

| | | |
|---|---|---|
| CN | 102376896 A | 3/2012 |
| CN | 103579532 A | 2/2014 |
| CN | 104112758 A | 10/2014 |
| JP | 2004-103488 A | 4/2004 |

OTHER PUBLICATIONS

Written Opinion of the International Searching Authority Appln. No. PCT/CN2014/090390; Dated Apr. 3, 2015.
First Chinese Office Action dated May 25, 2016; Appln. No. 201410309285.7.

* cited by examiner

US 9,640,560 B2

LIGHT-EMITTING DIODE (LED) DISPLAY PANEL, MANUFACTURING METHOD THEREOF AND DISPLAY DEVICE

TECHNICAL FIELD

At least one embodiment of the present invention relates to a light-emitting diode (LED) display panel, a manufacturing method thereof and a display device comprising the same.

BACKGROUND

Compared with liquid crystal displays (LCDs) dominating the market currently, LED displays have the advantages of simple process, wide viewing angle, rapid response speed, high brightness, high contrast, bright colors, wide operating range, light weight, low thickness and low power consumption.

SUMMARY

At least one embodiment of the present invention provides a light-emitting diode (LED) display panel, a manufacturing method thereof and a display device to solve the technical problems of the LED display panel: the scratches onto a thin-film transistor (TFT) backplane caused by an evaporation mask plate when a light-emitting structure is formed and the caused electrostatic problem.

At least one embodiment of the present invention provides an LED display panel, which comprises a thin film transistor (TFT) backplane, a light-emitting structure and an overcoat (OC) layer. The OC layer is disposed between the TFT backplane and the light-emitting structure and configured to cover gate lines and data lines in a display area of the LED display panel.

At least one embodiment of the present invention further provides a display device, which comprises the foregoing LED display panel.

At least one embodiment of the present invention further provides a method for manufacturing an LED display panel. The LED display panel comprises a TFT backplane and a light-emitting structure. The manufacturing method comprises: forming the TFT backplane; forming an OC layer configured to cover gate lines and data lines in a display area of the LED display panel; and forming one layer in the light-emitting structure on the OC layer.

BRIEF DESCRIPTION OF THE DRAWINGS

Simple description will be given below to the accompanying drawings of the embodiments to provide a more clear understanding of the technical proposals of the embodiments of the present invention. Obviously, the drawings described below only involve some embodiments of the present invention but are not intended to limit the present invention.

REFERENCE NUMBERS 1. base substrate; 2. gate electrode; 3. drain electrode; 4. source electrode; 5. passivation layer; 6. color filter (CF) layer; 7. resin layer; 8. anode; 9. luminous area defining layer; 10. overcoat layer; 11. EML; 12. cathode; 13. circuit on periphery of display area; 21. gate line; 22. data line.

DETAILED DESCRIPTION

For more clear understanding of the objectives, technical proposals and advantages of the embodiments of the present invention, clear and complete description will be given below to the technical proposals of the embodiments of the present invention with reference to the accompanying drawings of the embodiments of the present invention. Obviously, the preferred embodiments are only partial embodiments of the present invention but not all the embodiments. All the other embodiments obtained by those skilled in the art without creative efforts on the basis of the embodiments of the present invention illustrated shall fall within the scope of protection of the present invention.

The inventor of the application has found that: in the manufacturing process of an LED display panel, a mask plate and a thin film transistor (TFT) backplane must be tightly attached to each other when a light-emission layer is evaporated by mask evaporation; and if the edge of the mask plate has defects, the TNT backplane will be scratched during alignment, and hence undesirable phenomena such as short circuit and static electricity may be caused. Moreover, as the manufacturing process of the light-emission layer is very complex and multiple processes such as evaporation and chemical vapor deposition (CVD) are required, strong static electricity tends to be produced to damage the circuit.

Figure 1:
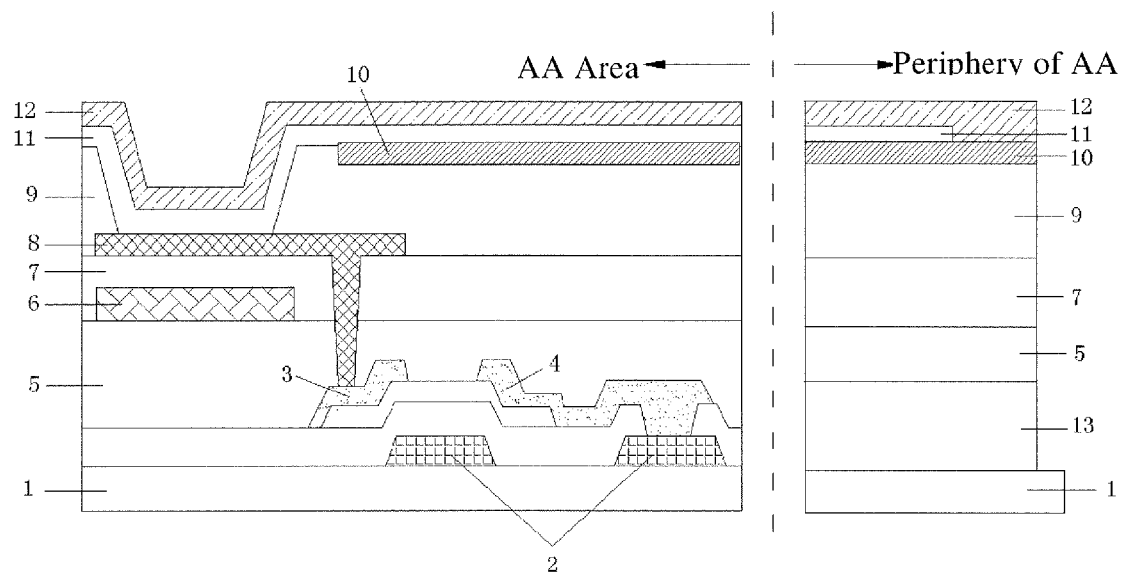
FIG. 1 is a schematic sectional view of an LED display panel provided by the embodiment of the present invention.
Figure 2:
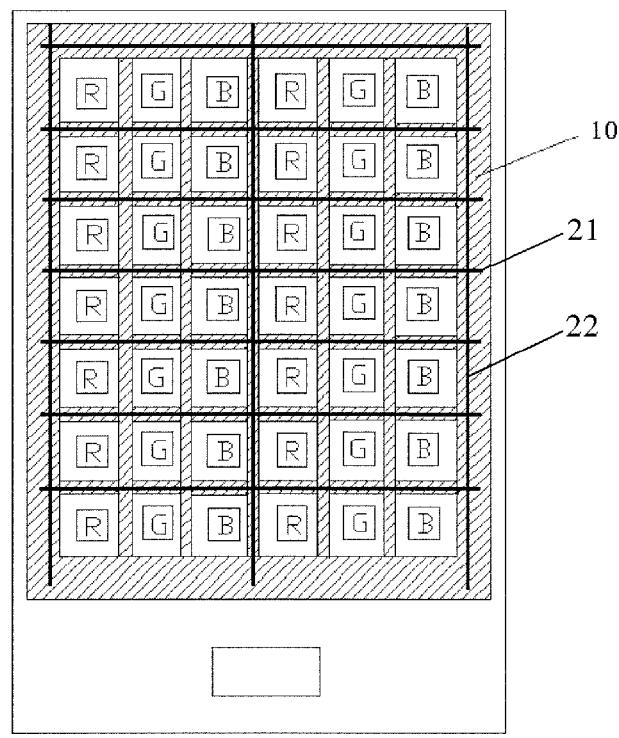
FIG. 2 is a plan view of the LED display panel provided by the embodiment of the present invention.

At least one embodiment of the present invention provides an LED display panel at first. The LED display panel may be an organic light-emitting diode (OLED) display panel. The schematic sectional view of the display panel is as shown in FIG. 1. The plan view of the display panel is as shown in FIG. 2.

The LED display panel comprises a TFT backplane, a light-emitting structure and an overcoat (OC) layer 10 which is disposed between the TFT backplane and the light-emitting structure. The OC layer 10 is configured to cover gate lines and data lines in a display area (AA area) of the LED display panel. For instance, as shown in FIG. 2, the OC layer 10 is provided in a grid structure for covering gate lines 21 and data lines 22 in the display area. The word "covering" refers to shielding in the vertical direction.

In the embodiment of the present invention, the TFT backplane may include a base substrate 1, gate electrodes 2, drain electrodes 3, source electrodes 4, a passivation layer 5 and the like, and the light-emitting structure includes an anode 8, a light-emission layer 11 and a cathode 12. As the step of forming the OC layer 10 may be executed before the mask evaporation of the light-emission layer 11, at least one part of the OC layer 10 makes contact with the light-emission layer 11 in the light-emitting structure. For instance, at least one part of the OC layer 10 makes contact with one side of the light-emission layer 11 in the light-emitting structure facing the TFT backplane. Therefore, the OC layer 10 can effectively avoid the scratches onto the line areas in the display area of the TFT backplane caused by the mask plate during the process of mask evaporation for the light-emission layer 11 and prevent the problems such as short circuit and static electricity caused by this.

In one embodiment, the OC layer 10 is also configured to cover the position of a circuit 13 on the periphery of the display area of the LED display panel. For instance, as shown in FIG. 2, the OC layer 10 is provided with a rectangular frame structure for covering the peripheral circuit on the periphery of the display area. The circuit 13 on the periphery of the display area includes a drive circuit, etc. Thus, the OC layer 10 can effectively avoid the scratches onto the peripheral circuit of the display area of the TFT backplane caused by a mask plate during the process of mask evaporation for the light-emission layer 11 and prevent the problems such as short circuit and static electricity caused by this. The material of the OC layer is not limited herein as long as the material has good hardness and can prevent the TFT backplane from being scratched by the mask plate.

In addition, the process of forming the cathode 12 may also adopt a mask evaporation method, and the step of forming the OC layer 10 may also be executed before the mask evaporation for the cathode 12, so that at least one part of the OC layer 10 may make contact with one side of the light-emission layer 11 in the light-emitting structure facing the cathode 12. Thus, the OC layer 10 can effectively avoid the scratches onto the light-emission layer 11 caused by a mask plate during the process of mask evaporation for the cathode 12.

In at least one embodiment, the OC layer 10 may be made from a conductive material and is electrically connected with the cathode 12. For instance, the OC layer 10 may be made from a metal material or a transparent conductive material such as ITO. ITO has good hardness after annealing crystallization and is suitable to prepare the OC layer just like a metal material. In this case, the OC layer 10 is connected in parallel with the cathode 12 and not only has the function of electrostatic shielding but also can reduce the internal resistance (IR) drop of the cathode 12. When the electric conductivity of the OC layer 10 is better, the IR drop of the cathode 12 is lower, and hence the light-emitting area can be appropriately increased.

The LED display panel as shown in FIG. 1 adopts s bottom-emission mode. As the luminous area defining layer 9 has defined the range of a luminous area and light will run through the TFT backplane, no black matrix (BM) is required in the bottom-emission mode due to the characteristics of the structure.

When top-emission mode is adopted, the cathode 12 is made from a transparent material. If the OC layer 10 is also made from a transparent conductive material, e.g., made form ITO, a black matrix must be formed subsequently to block light for TFTs. At this point, the LED display panel further comprises BMs which are configured to cover gate lines and data lines in a display area of the LED display panel.

If the OC layer 10 is made from a metallic material, because metal is light-tight, the OC layer 10 can achieve the light shielding effect of the TFTs simultaneously, so that the TFTs are not affected by light illumination. At this point, the subsequent manufacturing process of the BMs can be saved, and hence the cost can be reduced.

Taking the bottom-emission mode as shown in FIG. 1 as an example, the LED display panel provided by at least one embodiment of the present invention may comprise: a base substrate 1; a TFT array including gate electrodes 2, drain electrodes 3 and source electrodes 4 formed on the base substrate 1; a passivation layer 5, a color filter (CF) layer 6 and a resin layer 7 formed on the TFT array in sequence, in which the resin layer 7 is a transparent resin layer; and an anode 8 of the light-emitting structure, a luminous area defining layer 9, an OC layer 10, a light-emission layer 11 of the light-emitting structure, and a cathode 12 of the light-emitting structure formed on the resin layer 7 in sequence.

As described above, the embodiment of the present invention is also applicable to a top-emission mode LED display panel. No further description will be given here.

In the embodiment of the present invention, the process of the OC layer is added in the manufacturing process of the LED display panel, so that the scratches onto the TFT backplane caused by the evaporation mask when the light-emitting structure is formed and the electrostatic discharge caused by this can be effectively prevented. When the OC layer is conductive, the OC layer is connected with the cathode of the light-emitting structure of the display panel and the IR drop of the cathode can also be reduced. In addition, when the top-emission mode is adopted, as an opaque material such as metal is adopted to prepare the OC layer, the TFTs are protected from being affected by illumination. Thus, the subsequent manufacturing process of BMs can be saved, and hence the cost can be reduced.

At least one embodiment of the present invention further provides a display device, which comprises the LED display panel provided by the embodiment of the present invention. The display device may be: any product or component with display function such as a mobile phone, a tablet PC, a TV, a display, a notebook computer, a digital picture frame and a navigator.

At least one embodiment of the present invention further provides a method for manufacturing an LED display panel (e.g., an OLED display panel). The LED display panel comprises a TFT backplane and a light-emitting structure. The manufacturing method comprises: forming the TFT backplane; forming an OC layer which is configured to cover gate lines and data lines in a display area of the LED display panel; and forming one layer in the light-emitting structure on the OC layer (namely one side of the OC layer away from the TFT backplane, as shown in FIG. 1).

In one embodiment, the OC layer may also be configured to cover a circuit on the periphery of the display area of the LED display panel.

The word "one layer" may be a light-emission layer or a cathode in the light-emitting structure. The layer is generally required to be prepared by a process of mask evaporation. Compared with the processes such as photolithography, the operation of the process of mask evaporation is relatively simple, but the mask plate must be tightly attached to a substrate. The OC layer has the function of preventing the TFT backplane or the light-emission layer from being scratched by the mask plate during the process of mask evaporation and avoids the problems such as short circuit and electrostatic discharge caused by the scratches.

In at least one embodiment, the manufacturing method further comprises the step of annealing the OC layer between the step of forming the OC layer and the step of forming one layer in the light-emitting structure on the OC layer.

Taking the structure as shown in FIG. 1 as an example, in at least one embodiment, the step of forming one layer in the light-emitting structure on the OC layer 10 includes: forming a light-emission layer 11 of the light-emitting structure on the OC layer 10 by mask evaporation.

In one embodiment, before the step of forming the light-emission layer 11 of the light-emitting structure by mask evaporation, the manufacturing method further comprises: forming an anode 8 of the light-emitting structure on the TFT backplane (namely one side of the TFT backplane away from the base substrate 1); and forming a luminous area defining layer 9, so that one part of the luminous area defining layer 9 is formed on the anode 8 and one part of the OC layer 10 is formed on the luminous area defining layer 9.

In one embodiment, after the step of forming the light-emission layer 11 of the light-emitting structure by mask evaporation, the manufacturing method further comprises: forming a cathode 12 of the light-emitting structure. At this point, the OC layer 10 is made from a conductive material and electrically connected with the cathode 12. The electrical connection between the OC layer 10 and the cathode 12 not only can have the function of electrostatic shielding but also can reduce the IR drop of the cathode 12. When the electric conductivity of the OC layer 10 is better, the IR drop of the cathode 12 is lower, and hence the light-emitting area can be appropriately increased.

As described above, in the top-emission mode, if the OC layer is made from a transparent conductive material, the method for manufacturing the LED display panel further comprises the step of forming BMs.

Figure 3:
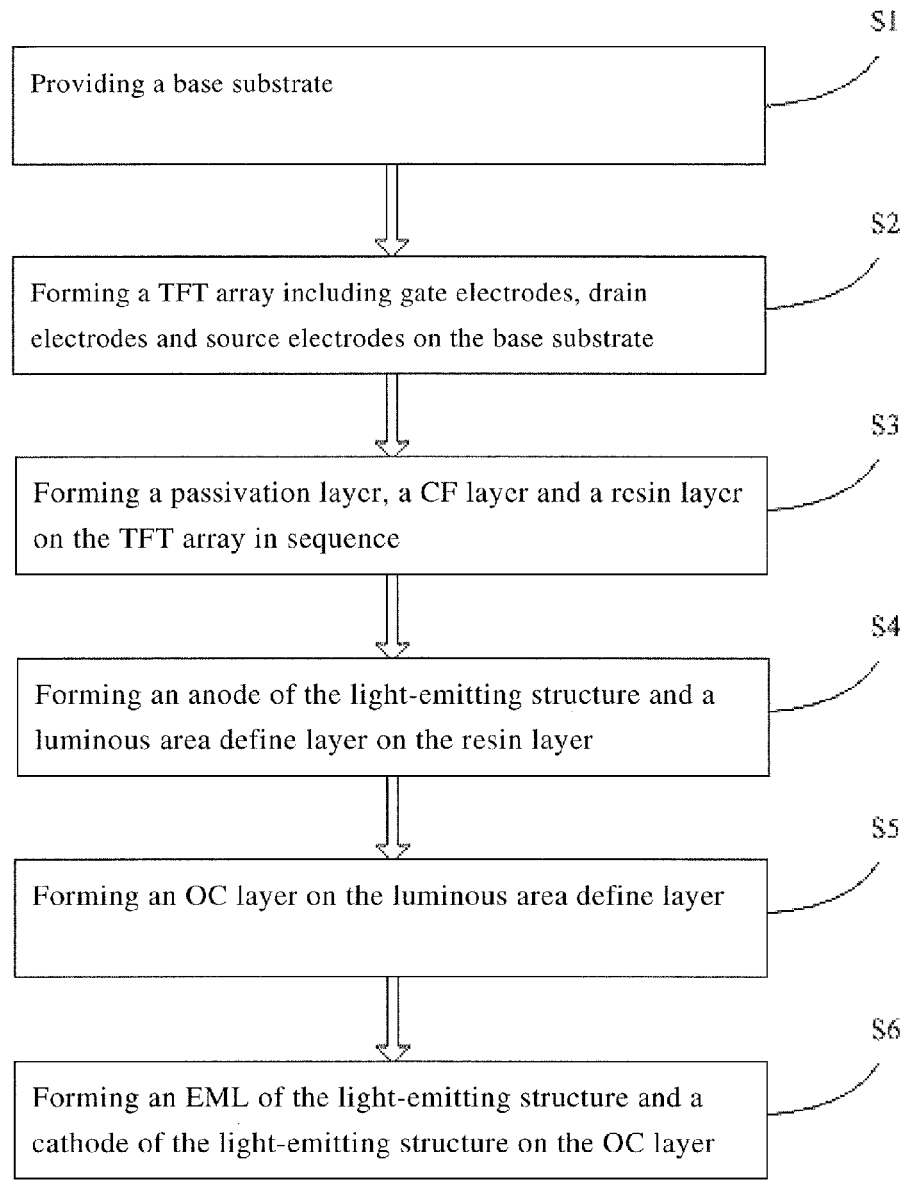
FIG. 3 is a flowchart of a method for manufacturing an LED display panel, provided by the present invention.

Taking the step of forming the light-emission layer in the light-emitting structure on the OC layer as an example, as shown in FIG. 3 which is a flowchart of the method for manufacturing the LED display panel, provided by the embodiment of the present invention, the method may comprise the following steps S1 to S6. Each of the following steps is described below.

S1: providing a base substrate.

S2: forming a TFT array including gate electrodes, drain electrodes and source electrodes on the base substrate.

S3: forming a passivation layer, a CF layer and a resin layer on the TFT array in sequence, in which the resin layer may be a transparent resin layer.

S4: forming an anode of the light-emitting structure and a luminous area defining layer on the resin layer.

S5: forming an OC layer on the luminous area defining layer, in which the OC layer is configured to cover gate lines and data lines in a display area of the LED display panel. In one example, the OC layer may also be configured to cover a circuit on the periphery of the display area of the LED display panel.

S6: forming a light-emission layer of the light-emitting structure and a cathode of the light-emitting structure on the OC layer. For instance, the OC layer is made from a conductive material and electrically connected with the cathode. For instance, the light-emission layer of the light-emitting structure may be an organic light emission layer.

In the embodiment of the present invention, the process of the OC layer is added in the manufacturing process of the OELD display panel, so that the scratches onto the TFT backplane caused by the evaporation mask when the light-emitting structure is formed and the electrostatic discharge caused by this can be effectively prevented. When the OC layer is conductive, the OC layer is connected with the cathode of the light-emitting structure of the display panel, and hence the IR drop of the cathode can also be reduced.

In the top-emission mode, the cathode is made from a transparent material. If the OC layer is also made from a transparent conductive material, e.g., made from ITO, BMs must be formed subsequently to block light for TFTs. At this point, the OLED display panel further comprises BMs which are configured to cover gate lines and data lines in a display area of the OLED display panel.

If the OC layer is made from a metallic material, because metal is light-tight, the OC layer can achieve the light shield effect of the TFTs simultaneously, so that the TFTs are not affected by illumination. At this point, the subsequent manufacturing process of BMs can be saved, and hence the cost can be reduced.

The foregoing is only the preferred embodiments of the present invention and not intended to limit the scope of protection of the present invention. The scope of protection of the present invention should be defined by the appended claims.

The application claims priority to the Chinese patent application No. 201410309285.7, filed Jul. 1, 2014, the disclosure of which is entirely incorporated herein by reference as part of the application.

The invention claimed is:

1. A light-emitting diode (LED) display panel, comprising a thin-film transistor (TFT) backplane, a light-emitting structure, and an overcoat (OC) layer,
   wherein the OC layer is disposed between the TFT backplane and the light-emitting structure and configured to cover gate lines and data lines in a display area of the LED display panel; and
   at least one part of the OC layer makes contact with a light emission layer in the light-emitting structure.

2. The LED display panel according to claim 1, wherein the OC layer is also configured to cover a circuit on a periphery of the display area of the LED display panel.

3. The LED display panel according to claim 1, wherein the light-emitting structure includes a cathode; and the OC layer is made from a conductive material and electrically connected with the cathode.

4. The LED display panel according to claim 3, wherein the OC layer is made from a transparent conductive material.

5. The LED display panel according to claim 4, wherein the LED display panel adopts a top-emission mode and further comprises a black matrix.

6. The LED display panel according to claim 4, wherein the OC layer is made from indium tin oxide (ITO).

7. The LED display panel according to claim 3, wherein the OC layer is made from metal.

8. A display device, comprising the LED display panel according to claim 1.

9. A method for manufacturing an LED display panel, the LED display panel comprising a TFT backplane and a light-emitting structure, the manufacturing method comprising:
   forming the TFT backplane;
   forming an OC layer configured to cover gate lines and data lines in a display area of the LED display panel; and
   forming one layer in the light-emitting structure on the OC;
   wherein the step of forming one layer in the light-emitting structure on the OC layer includes: forming a light-emission layer of the light-emitting structure on the OC layer by mask evaporation; and
   before the step of forming the light-emission layer of the light-emitting structure, further comprising;
   forming an anode of the light-emitting structure on the TFT backplane; and
   forming a luminous area defining layer, wherein one part of the luminous area defining layer is formed on the anode, and one part of, the OC layer is formed on the luminous area defining layer.

10. The method for manufacturing the LED display panel according to claim 9, wherein the OC layer is also configured to cover a circuit on a periphery of the display area of the LED display panel.

11. The method for manufacturing the LED display panel according to claim 9, between the step of forming the OC layer and the step of forming one layer in the light-emitting structure on the OC layer, further comprising:
annealing the OC layer.

12. The method for manufacturing the LED display panel according to claim 9, after the step of forming the light-emission layer of the light-emitting structure, further comprising:
forming a cathode of the light-emitting structure, wherein the OC layer is made from a conductive material and electrically connected with the cathode.

13. The method for manufacturing the LED display panel according to claim 12, wherein the OC layer is made from a transparent conductive material; and the method for manufacturing the LED display panel further comprises:
forming a black matrix.

14. The LED display panel according to claim 2, wherein at least one part of the OC layer makes contact with a light emission layer in the light-emitting structure.

15. The method for manufacturing the LED display panel according to claim 10, between the step of forming the OC layer and the step of forming one layer in the light-emitting structure on the OC layer, further comprising:
annealing the OC layer.

16. The method for manufacturing the LED display panel according to claim 10,
wherein the step of forming one layer in the light-emitting structure on the OC layer includes: forming a light-emission layer of the light-emitting structure on the OC layer by mask evaporation.

17. The method for manufacturing the LED display panel according to claim 16, before the step of forming the light-emission layer of the light-emitting structure, further comprising:
forming an anode of the light-emitting structure on the TFT backplane; and
forming a luminous area defining layer, wherein one part of the luminous area defining layer is formed on the anode, and one part of the OC layer is formed on the luminous area defining layer.

* * * * *